(12) United States Patent
Asamura et al.

(10) Patent No.: US 8,558,629 B2
(45) Date of Patent: Oct. 15, 2013

(54) TEMPERATURE-CONTROLLED CRYSTAL OSCILLATING UNIT AND CRYSTAL OSCILLATOR

(75) Inventors: Fumio Asamura, Saitama (JP); Takehito Ishii, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 46 days.

(21) Appl. No.: 13/309,579

(22) Filed: Dec. 2, 2011

(65) Prior Publication Data

US 2012/0139648 A1 Jun. 7, 2012

(30) Foreign Application Priority Data

Dec. 6, 2010 (JP) ................................. 2010-271157

(51) Int. Cl.
*H03B 5/32* (2006.01)

(52) U.S. Cl.
USPC .. 331/158; 331/176; 331/177 V; 331/116 FE; 331/116 R

(58) Field of Classification Search
USPC ........... 331/158, 176, 177 V, 116 R; 310/311, 310/315
See application file for complete search history.

(56) References Cited

U.S. PATENT DOCUMENTS 7,674,038 B2 * 3/2010 Heine et al. ................... 374/141

FOREIGN PATENT DOCUMENTS

| JP | H06-085523 | 3/1994 |
|---|---|---|
| JP | H09-153761 | 6/1997 |
| JP | H11-041032 | 2/1999 |
| JP | 2004-343681 | 12/2004 |
| JP | 2005-124129 | 5/2005 |

OTHER PUBLICATIONS

Abramzon et al., "Long-Term Stability (Aging) of Evacuated Hybrid Ocxo", 2001 IEEE International Frequency Control Symposium and PDA Exhibition, 2001, pp. 786-789.

* cited by examiner

*Primary Examiner* — Arnold Kinkead
(74) *Attorney, Agent, or Firm* — Jianq Chyun IP Office

(57) ABSTRACT

A temperature-controlled crystal oscillating unit and oscillator are provided, which can stabilize an output frequency thereof, have firmness against shock of falling etc., and are suitable for miniaturization and mass production. A crystal blank for the temperature-controlled crystal oscillating unit is formed by an inner region which is an oscillating plate; an outer region which surrounds the periphery of the inner region; and a connection portion which connects the inner region with the outer region. Electrodes are formed on two surfaces of the inner region, and a heater and a temperature sensor are disposed to surround the periphery of the electrode on one surface of the inner region where the electrode is formed thereon. The electrodes, the heater and the temperature sensor are respectively connected with terminals on the outer region by leads. A contact area between the temperature sensor and a crystal is increased.

19 Claims, 5 Drawing Sheets

TEMPERATURE-CONTROLLED CRYSTAL OSCILLATING UNIT AND CRYSTAL OSCILLATOR

CROSS-REFERENCE TO RELATED APPLICATION

This application has a priority of Japanese no. 2010-271157 filed Dec. 6, 2010, hereby incorporated by reference.

BACKGROUND OF THE INVENTION

1. Field of the Invention

The invention relates to a temperature-controlled crystal oscillating unit and in particular relates to a temperature-controlled crystal oscillating unit and a crystal oscillator, which can stabilize output frequency, have firmness against shock of falling, and are suitable for miniaturization and mass production.

2. Description of the Related Art

The structure of a conventional temperature-controlled crystal oscillating unit is described below with reference to FIG. 8. FIG. 8 is a schematic diagram illustrating the structure of the conventional temperature-controlled crystal oscillating unit (Non-patent Reference 1). Moreover, FIG. 8 is a planar schematic view of the structure depicted in the cross-sectional view of Non-patent Reference 1.

As shown in FIG. 8, the conventional temperature-controlled crystal oscillating unit comprises crystal electrodes 51a and 51b (excitation electrodes), formed on two sides of an SC (stress compensated)-cut crystal blank 50 that is formed into a planar circle; heaters 52a and 52b that are respectively formed into semicircular shape on two surfaces and along a periphery of the crystal blank 50 for heating the crystal blank 50; and a temperature sensor 53 for detecting a temperature of the crystal blank 50.

The crystal electrode 51a, disposed on a front surface of the crystal blank 50, is connected with an electrode positioned in a top direction of FIG. 8; and the crystal electrode 51b, disposed on a back surface of the crystal blank 50, is connected with an electrode positioned in a bottom direction of FIG. 8. The heaters 52a and 52b are connected with electrodes respectively disposed in a left direction and a right direction of FIG. 8.

The temperature sensor 53 is constructed by a thermo-couple, and is in contact with a point on the front surface of a crystal substrate near the heater 52a and on one surface of the crystal blank 50 (the front surface, according to FIG. 8), for detecting temperature. In addition, to prevent heat radiation by thermal conduction, the aforesaid structure is sealed in a vacuum package (TO-8 package), so as to form the temperature-controlled crystal oscillating unit.

A crystal oscillator that utilizes the temperature-controlled crystal oscillating unit comprises a temperature control circuit, which controls the current or voltage to the heaters 52a and 52b based on the temperature detected by the temperature sensor 53. In the case of using an SC-cut crystal blank, the temperature is controlled to be about 85° C.

In addition, "Long term stability (aging) of evacuated hybrid OCXO", Igor Abramzon et al, 2001 IEEE International Frequency Control Symposium and PDA Exhibition (Non-patent Reference 1) has disclosed technology related to crystal oscillating unit. Non-patent Reference 1 discloses the influence of frequency variation due to temperature and aging, in regard to OCXO.

Furthermore, JP 6-85523 (Patent Reference 1) and JP 11-41032 (Patent Reference 2) have disclosed technology regarding temperature-controlled crystal oscillating unit. Patent Reference 1 discloses a surface elastic wave element, in which a temperature sensor and a heater are disposed on the same surface where the comb-type electrodes of a piezoelectric substrate are formed and at the two sides of the electrodes. Patent Reference 2 discloses a structure which comprises a tube-shaped cap disposed on an outer side of a case of a crystal oscillating unit, and the tube-shaped cap has a temperature sensor and a heater.

In addition, JP 9-153761 (Patent Reference 3), JP 2004-343681 (Patent Reference 4), and JP 2005-124129 (Patent Reference 5) have also disclosed relevant technology. Patent Reference 3 discloses a surface-mount crystal oscillating unit, in which a concave space is formed on a back surface at the bottom of the package, and an electronic component for temperature compensation is disposed in the concave space. Patent Reference 4 discloses a temperature compensated crystal oscillating unit, in which a temperature compensation IC is packaged in a concave on one surface, which is opposite to the surface where an oscillating unit is bonded. Patent Reference 5 discloses a crystal oscillator which uses a thermostat bath, wherein a chip resistor for heat generation, an oscillating element, and a temperature control element having large temperature dependency are disposed on the same surface of a substrate, and directly bonded by a thermo-conductive material.

Patent Reference 1: JP 6-85523
Patent Reference 2: JP 11-41032
Patent Reference 3: JP 9-153761
Patent Reference 4: JP 2004-343681
Patent Reference 5: JP 2005-124129
Non-patent Reference 1: "Long term stability (aging) of evacuated hybrid OCXO", Igor Abramzon et al, 2001 IEEE International Frequency Control Symposium and PDA Exhibition However, in the conventional temperature-controlled crystal oscillating unit, the thermocouple is in contact with the crystal blank at one point, and as a result, the temperature cannot be detected accurately and the output frequency thereof is unstable. In addition, the conventional temperature-controlled crystal oscillating unit is damageable to vibration or shock, and the thermocouple may be separated from the crystal by shock of falling, etc. Moreover, the conventional temperature-controlled crystal oscillating unit is formed by performing vacuum-sealing into a package respectively, and thus is difficult to be applied in miniaturization and mass production.

SUMMARY OF THE INVENTION

Considering the above, the invention provides a temperature-controlled crystal oscillating unit and a crystal oscillator, which can stabilize the output frequency, have firmness against shock caused by falling, and are suitable for miniaturization and mass production.

For solving the aforementioned conventional problems, the invention provides a temperature-controlled crystal oscillating unit, having a crystal plate, having two surfaces on which electrodes are disposed thereon; a heater, for heating the crystal plate; and a sensor, for detecting a temperature of the crystal plate. The temperature-controlled crystal oscillating unit comprises a crystal blank. The crystal blank further comprises the crystal plate; an outer region formed for surrounding a periphery of the crystal plate; and a connection portion disposed for connecting the crystal plate with the outer region. On the crystal blank, the heater and the sensor are disposed to surround a periphery of the electrode on one surface or the other surface of the crystal plate, and the electrodes, the heater and the sensor are connected to terminals on the outer region by leads respectively. A contact area between the sensor and the crystal plate is increased, and thus the temperature of the crystal plate can be detected more accurately and the output frequency is stabilized. In addition, the structure of the temperature-controlled crystal oscillating unit has better firmness against vibration and shock.

In the crystal blank of an embodiment of the invention, the leads are formed on the connection portion, and a pattern of the leads can be formed by the same fabrication process of the heater or the temperature sensor. Thus, the fabrication can be simplified.

Moreover, in an embodiment of the invention, the leads are wire bondings. It is not required to perform a high-precision sophisticated process to form multiple leads on the thin connection portion. Thus, the temperature-controlled crystal oscillating unit can be easily produced by simple fabrication equipment.

Additionally, in an embodiment of the invention, the heater and the sensor are formed by resistive bodies that are formed at a temperature under a crystal α-β transient temperature, and thus crystal characteristics can be maintained.

In one embodiment of the invention, the crystal blank is a one-side-holding type, wherein the connection portion is disposed on one side of the crystal plate.

In the crystal blank of an embodiment of the invention, the connection portion is disposed at two positions on one side of the crystal plate.

In another embodiment of the invention, the crystal blank is a two-side-holding type, wherein connection portions are disposed on two opposite sides of the crystal plate.

Moreover, according to an embodiment of the invention, the crystal blank is clamped between two silicon plates, each of which has a concave thereon, and vacuum bonded in a state of being accommodated in the concaves of the silicon plates, so as to form a temperature-controlled crystal oscillating unit. The crystal blank is formed on a crystal wafer, and the silicon plates are formed on silicon wafers. The three wafers are bonded and then cut into the respective temperature-controlled crystal oscillating unit. Thus, there is an effect that the productivity can be increased.

In the temperature-controlled crystal oscillating unit of an embodiment of the invention, the silicon plate has resistivity, which provides a shield effect for shielding an electromagnetic field and thus the crystal oscillating unit is difficult to be affected by an external electromagnetic wave.

The invention further provides a crystal oscillator, comprising the aforesaid temperature-controlled crystal oscillating unit, an oscillating circuit and a temperature control circuit. A variable-capacitive diode disposed at an input side of the oscillating circuit is disposed on the crystal plate of the temperature-controlled crystal oscillating unit, and the temperature variation of the variable-capacitive diode is made the same as that of the crystal. Therefore, high-precision temperature control can be performed on the crystal, and the output frequency can be stabilized.

In the crystal oscillator according to an embodiment of the invention, the variable-capacitive diode is disposed on the surface of the crystal plate, on which the heater is formed.

In the crystal oscillator according to an embodiment of the invention, the variable-capacitive diode is disposed on one surface of the crystal plate, which is different from the surface where the heater is formed.

In the crystal oscillator according to an embodiment of the invention, a chip resistor, which adjusts a current flown to the heater, is connected to the temperature control circuit. By selecting and connecting the chip resistor with a proper resistance, the temperature of the heater can be set to a temperature around an inflection point of the frequency-temperature characteristic curve of the installed crystal oscillating unit. According to the individual differences of the crystal oscillating units, the temperature of the heater can be adjusted to reduce frequency variation caused by temperature as much as possible. Consequently, the output frequency can be further stabilized.

Additionally, in the crystal oscillator according to an embodiment of the invention, the oscillating circuit and the temperature control circuit are integrated into an integrated circuit. The integrated circuit further comprises a resistor adjusting the current flown to the heater according to a set resistance and a non-volatile memory storing a plurality of resistances in the integrated circuit. A resistance selected from the plurality of resistances stored in the non-volatile memory is set to the resistor, and a proper resistance is set. In this way, the temperature of the heater can be set at a temperature around the inflection point of the frequency-temperature characteristic curve of the installed crystal oscillating unit. According to the individual difference of the crystal oscillating unit, the temperature of the heater can be adjusted to reduce frequency variation caused by temperature as much as possible. Consequently, the output frequency can be further stabilized. In addition, compared with a chip resistor that is installed externally, the installation and adjustment processes can be simplified.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF REFERENCE NUMERALS

Figure 1:
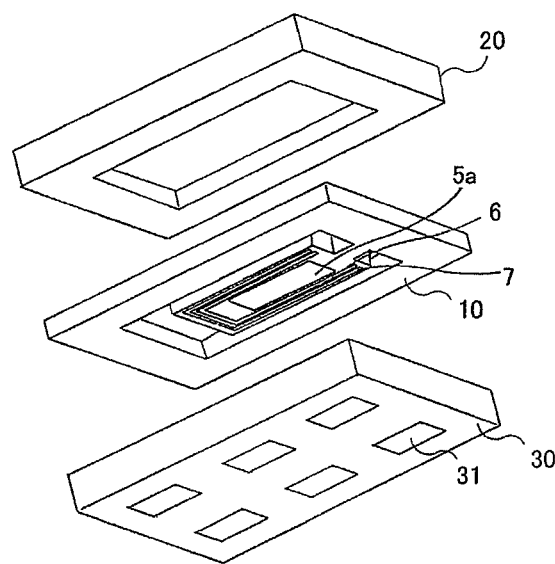
FIG. 1 is a perspective view illustrating a temperature-controlled crystal oscillating unit according to the first exemplary embodiment of the invention.

1 . . . inner region; 2 . . . outer region; 3 . . . connection portion; 4 . . . separation portion; 5, 51 . . . crystal electrode; 6 . . . temperature sensor; 7, 52 . . . heater; 9, 13 . . . wire bonding; 10, 50 . . . crystal blank; 11 . . . crystal oscillating unit; 12 . . . variable-capacitive diode; 20, 30 . . . plate; 31 . . . electrode; 41 . . . resistor; 42 . . . oscillating circuit; 43 . . . output buffer; 44 . . . constant-voltage power source; 45 . . . temperature control circuit; 46 . . . chip resistor; 53 . . . temperature sensor (thermocouple)

DESCRIPTION OF THE PREFERRED EMBODIMENT

Exemplary embodiments of the invention are described below with reference to the accompanying drawings.

According to the exemplary embodiments of the invention, a temperature-controlled crystal oscillating unit comprises a crystal plate with electrodes formed on two surfaces thereof; an outer region formed to surround a periphery of the crystal plate; and a connection portion connecting the crystal plate with the outer region. The temperature-controlled crystal oscillating unit further comprises a heater and a temperature sensor, which are disposed to surround the periphery of the electrode that is formed on one surface of the crystal plate. The electrode, the heater and the temperature sensor are connected to terminals on the outer region by leads respectively. The temperature sensor is in contact with the crystal plate by a larger area, not just one point, and in this way the temperature of the crystal plate can be detected more accurately, the output frequency can be stabilized, and the temperature-controlled crystal oscillating unit can have better firmness against vibration and shock.

In an exemplary embodiment of the invention, a crystal blank having the aforesaid structure is clamped and vacuum-sealed by silicon plates from top and bottom, which is then respectively cut apart. Thus, the temperature-controlled crystal oscillating unit can be easily miniaturized and is advantageous in mass production.

According to an exemplary embodiment of the invention, a crystal oscillator comprises a temperature-controlled crystal oscillating unit having the aforesaid structure and an oscillating circuit, and a variable-capacitive diode is further disposed on the surface of the crystal plate where the heater is formed. The variable-capacitive diode is a main cause of large temperature variation in the oscillating circuit. By fixing the variable-capacitive diode on the crystal blank, temperature detection can be carried out in a condition that the variable-capacitive diode is contained.

Furthermore, in the crystal oscillator according to an exemplary embodiment of the invention, a chip resistor with proper resistance is connected to the temperature control circuit, so that the temperature of the heater can be controlled at a temperature around the inflection point of the frequency-temperature characteristic curve of the crystal oscillating unit. Accordingly, individual difference of the crystal oscillating unit can be absorbed so as to obtain a stabilized output.

First Embodiment

The structure of a temperature-controlled crystal oscillating unit in the first embodiment of the invention is described in the following paragraphs with reference to FIG. 1. FIG. 1 is a schematic perspective view illustrating the temperature-controlled crystal oscillating unit according to the first exemplary embodiment of the invention. As shown in FIG. 1, the temperature-controlled crystal oscillating unit of the first embodiment (i.e., the first crystal oscillating unit) is formed by clamping, bonding, and vacuum-sealing a crystal blank 10 where an oscillating plate is formed thereon, with a plate 20 and a plate 30 from, top and bottom.

The crystal blank 10 can be an AT-cut or ST-cut crystal plate, for example. As described below, the crystal blank 10 comprises an outer region, equivalent to an outer frame, and an inner region, equivalent to the oscillating plate. A space (gap) is formed between the outer region and the inner region to separate the outer region from the inner region. The outer region and the inner region are connected with each other by a connection portion shaped like a thin neck. And, the inner region is equivalent to a crystal plate, as defined in claims.

In addition, crystal electrodes 5 are disposed on two surfaces of the inner region. On one surface of the inner region (bottom surface according to FIG. 1), a temperature sensor 6 for detecting the temperature of the inner region, and a heater 7 for heating the inner region, are configured to surround the periphery of the crystal electrode 5. The specific structure of the crystal blank 10 is described hereinafter. The temperature sensor 6 is equivalent to a sensor, as defined in claims.

The plate 20 and the plate 30 are formed by such as silicon implanted with phosphorous or fluorine to lower resistivity. Concaves are respectively formed in the plate 20 and the plate 30 to accommodate the crystal blank 10. Moreover, a plurality of electrodes 31 are disposed on a bottom surface of the plate 30 for connecting the crystal electrode 5, the temperature sensor 6 and heater 7 of the crystal blank 10. One of the plurality of electrodes 31 is a GND electrode, which sets the plate 20 at a ground level. In addition, a via hole for setting the plate 20 to the ground level is formed in the crystal blank 10 and is connected to the GND electrode of the plate 30. For example, the plate 20 is formed by silicon with low resistivity and the plate 30 is formed by silicon with high resistivity.

Since the plate 20 and the plate 30 are respectively formed by silicons with proper resistivities, shielding effect can be obtained, and it decreases the possibility of influence from an external electromagnetic wave. In addition, the plate 20 and the plate 30 can also be formed of glass, but in that case, shielding effect cannot be obtained. The structures described in the second and the third embodiments are also formed by bonding the plate 20, the crystal blank 10 and the plate 30.

Figure 2:
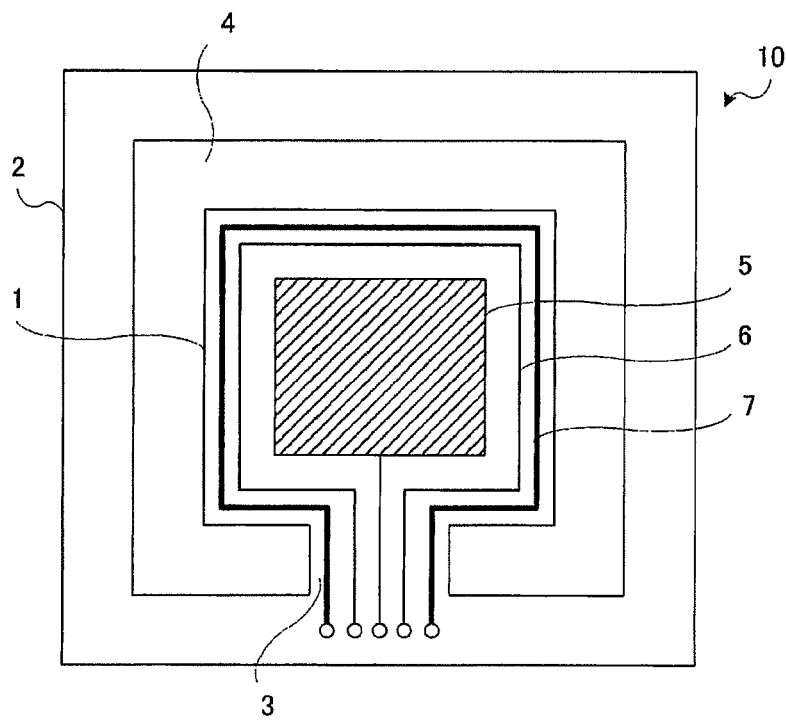
FIG. 2 illustrates a structure of a first crystal blank.

Next, the structure of the first crystal blank is described below with reference to FIG. 2. FIG. 2 is a schematic diagram showing the structure of the first crystal blank. According to FIG. 2, the first crystal blank 10 comprises an inner region 1 and an outer region 2, and a gap which serves as a separation portion 4 is formed between the inner region 1 and the outer region 2. Further, the inner region 1 and the outer region 2 are connected by a connection portion 3. The inner region 1 and the outer region 2 have the same thickness.

As described above, because the inner region 1 and the outer region 2 are connected by the thin connection portion 3, the heat from the inner region 1 that is heated by the heater 7 can be prevented from releasing to the outer region 2. The first crystal blank 10 is one-side-holding type, that is the inner region 1, i.e. an oscillating portion, is held by the connection portion 3 at one side.

Moreover, the crystal electrodes 5 are formed on two surfaces of the inner region 1 to serve as excitation electrodes. On any one surface of the inner region 1, the temperature sensor 6 is shaped like a strip (or a line) and surrounds the periphery of the crystal electrode 5. The heater 7 is also shaped like a strip (or a line) and disposed further outside temperature sensor 6. In this embodiment, the temperature sensor 6 is positioned on the inside and the heater 7 is positioned on the outside. However, it is also possible to dispose the heater 7 on the inside and dispose the temperature sensor 6 on the outside. In addition, the temperature sensor 6 and the heater 7 can be formed on different surfaces.

The temperature sensor 6 is formed by a resistive body where a current varies according to temperature when a constant voltage is applied, and a current value is used for detecting the temperature. The heater 7 is formed by a resistive body such as ITO (Indium Tin Oxide), and can heat the first crystal blank 10 to a desired temperature (about 85° C.). Moreover, the temperature sensor 6 and the heater 7 are formed by sputter at a temperature under a crystal α-β transient temperature (573° C.).

As described above, in the first crystal blank 10, the temperature sensor 6 not only contacts the inner region 1 of the crystal blank 10 at one point, but is disposed like a strip around the periphery of the crystal electrode 5 of the inner region 1, so that the contact area can be enlarged. In this manner, the precision of temperature detection can be improved. Further, the first crystal blank 10 can have a firm structure against shock, and the temperature sensor 6 and the crystal plate can remain in contact even when shock such as falling occurs.

Leads of the crystal electrode 5, the temperature sensor 6, and the heater 7 are formed on the connection portion 3, and are connected with terminals disposed on the outer region 2 respectively. The lead of the crystal electrode 5 on the back surface is disposed on the back surface of the connection portion 3.

Each of the crystal electrode 5, the temperature sensor 6 and the heater 7 of the first crystal blank 10 can be formed by sputtering and etching processes on a crystal wafer. Therefore, the fabrication process of the crystal electrode 5, the temperature sensor 6 and the heater 7 can be formed with the same process. Thus, the fabrication of the first crystal blank 10 can be simplified.

In addition, the plate 20 and the plate 30 are respectively formed on silicon wafers. After a wafer process of the plate 20, the crystal blank 10, and the plate 30 is completed, the three pieces of wafers are stacked and bonded in vacuum to vacuum-seal each crystal blank 10. The outer region 2 of the crystal blank 10 is bonded to the plate 20 and the plate 30 at an edge portion of the outer region 2, and the inner region 1 is accommodated in the concaves formed on the plate 20 and the plate 30. Thereafter, the bonded wafers are cut to obtain the temperature-controlled crystal oscillating units. Since the wafers are bonded first before cutting, the productivity is improved compared with sealing crystal plates into packages one by one.

Second Embodiment

A crystal blank according to the second embodiment of the invention is described as follows. In the first crystal blank 10, the leads of the crystal electrode 5, the temperature sensor 6 and the heater 7 are arranged parallely on the thin connection portion 3 and a lead pattern is formed on the first crystal blank 10, which is a simple fabrication process. However, because a linewidth of the leads and an interval between the leads need to be narrowed, high-precision delicate processing is required. The crystal blank of the second embodiment of the invention (i.e. second crystal blank) can be fabricated without high-precision delicate processing.

Figure 3:
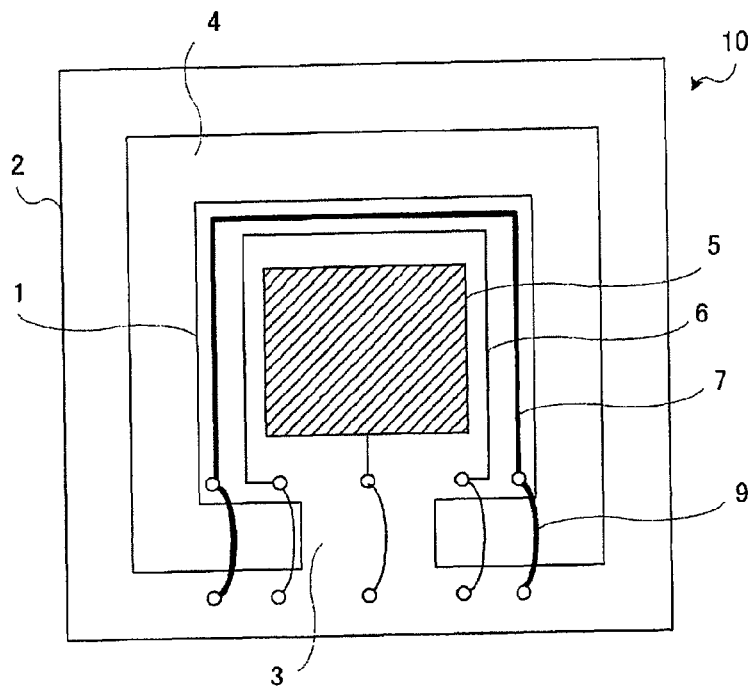
FIG. 3 illustrates a structure of a second crystal blank.

FIG. 3 is a schematic diagram illustrating a structure of the second crystal blank. As shown in FIG. 3, the second crystal blank comprises an inner region 1 with almost the same structure as that in the first crystal blank. Crystal electrodes 5 are disposed on two opposite surfaces of the inner region 1, and the temperature sensor 6 and the heater 7 are arranged around the periphery of the crystal electrode 5 on one surface of the inner region 1. In the second crystal blank, the leads of the crystal electrode 5, the temperature sensor 6 and the heater 7 are formed by wire bonding 9, and are connected to the terminals arranged on the outer region 2 across the separation portion 4.

In this way, the second crystal blank does not require the formation of multiple leads on the thin connection portion 3 and thus can be easily fabricated by using simple fabrication equipment.

Figure 4:
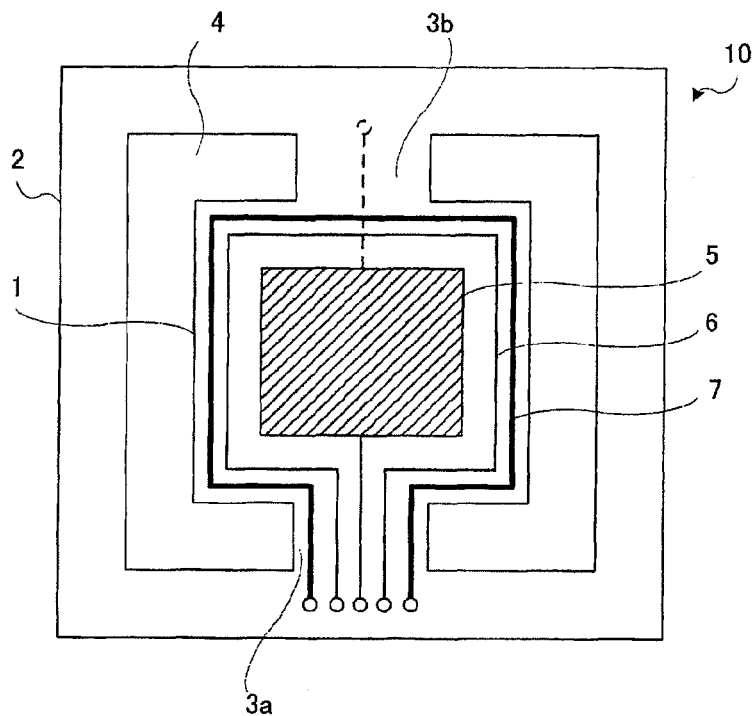
FIG. 4 illustrates a structure of the first crystal blank of two-side-holding type.

The following paragraphs describe an example of the two-side-holding type based on FIG. 4. FIG. 4 is a schematic diagram illustrating a first crystal blank of two-side-holding type. As shown in FIG. 4, the two-side-holding type first crystal blank comprises two connection portions 3a and 3b, for connecting the inner region 1 with the outer region 2. The connection portions 3a and 3b are formed in a manner to hold two opposite sides of the inner region 1. The leads of the crystal electrode 5a, the temperature sensor 6 and the heater 7 are disposed on a front surface of the connection portion 3a. The lead of the crystal electrode 5b on the back surface is disposed on a back surface of the connection portion 3b.

In this embodiment, all the leads on the front surface of the crystal blank 10 are drawn from the side the connection portion 3a. However, a part or all of the leads can also be drawn from the side of the connection portion 3b. For example, if the lead of the temperature sensor 6 is drawn from the side of the connection portion 3b, the interval between the leads of the crystal electrode 5a and the heater 7 on the connection portion 3a can be enlarged, and the fabricating process would become easier.

Third Embodiment

Figure 5:
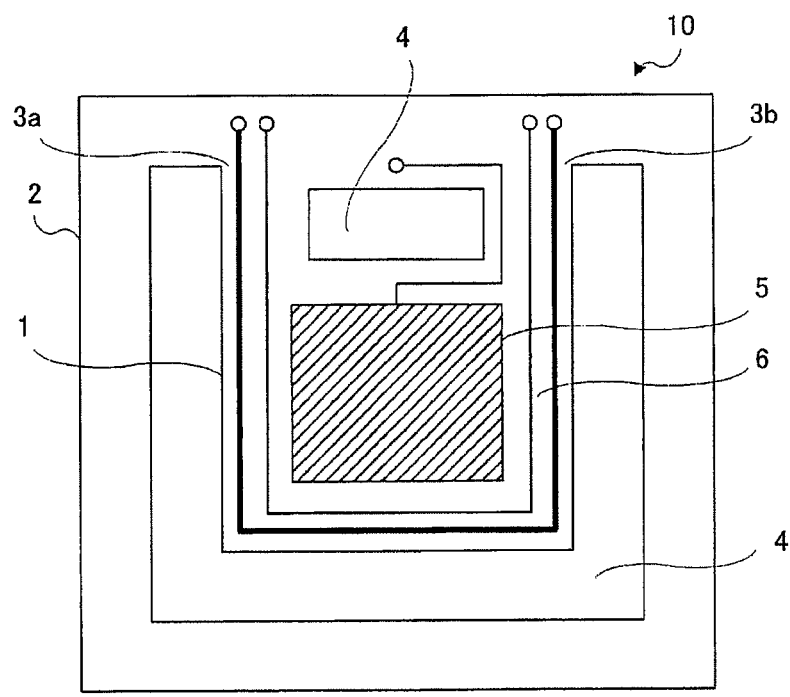
FIG. 5 is a schematic view of a crystal blank according to the third exemplary embodiment of the invention.

A crystal blank according to the third embodiment of the invention is described hereinafter with reference to FIG. 5. FIG. 5 is a diagram illustrating the crystal blank according to the third embodiment of the invention. As depicted in FIG. 5, the crystal blank of the third embodiment (i.e. third crystal blank) comprises two connection portions 3a and 3b, and the connection portions 3a and 3b, which connect the inner region 1 with the outer region 2, are disposed on the same side of the inner region 1.

The structure of the aforesaid inner region 1 is almost the same as that in the first crystal blank. Crystal electrodes 5 are disposed on two opposite surfaces of the inner region 1, and the temperature sensor 6 and the heater 7 are formed to surround three sides of the crystal electrode 5 on one surface of the inner region 1. The leads of the temperature sensor 6 and the heater 7 are formed on the connection portions 3a and 3b to connect the terminals on the outer region 2. Furthermore, the lead of the crystal electrode 5 is formed to pass by the connection portion 3a or 3b. In this way, the number of the leads formed on each of the connection portions 3 can be reduced, and thus the fabricating process is simplified.

According to the crystal blanks described in the embodiments of the invention, the crystal electrodes 5 are disposed on two opposite surfaces of the inner region 1 of the crystal blank 10, and the temperature sensor 6 and the heater 7 are formed to surround the periphery of the crystal electrode 5 on one surface of the inner region 1. Thus, the contact area between the temperature sensor 6 and the crystal blank 10 can be increased, the temperature can be detected correctly, and the output frequency thereof can be stabilized. Furthermore, the crystal blanks have effects capable of increasing firmness against shock.

Additionally, in the crystal blanks of the embodiments, the separation portion 4, i.e. a space, is formed to separate the inner region 1 from the outer region 2 which surrounds the inner region 1. The inner region 1 and the outer region 2 are connected by the thin neck-shaped connection portion 3, and thus the heat of the inner region 1 can be prevented from releasing outside as much as possible, temperature variation can be prevented, and the output can be stabilized.

Moreover, according to the crystal blanks of the embodiments, the crystal blank 10 formed on the crystal wafer is clamped by the silicon plates 20 and 30 formed on silicon wafers. Since the crystal blanks are formed by bonding and then cutting the three layers, the productivity can be increased.

Furthermore, in the second crystal blank, the leads of the crystal electrode 5, the temperature sensor 6 and the heater 7 are formed by wire bonding and connected to the terminals on the outer region 2. Therefore, the second crystal blank does not require high-fine fabrication process and can be produced by using simple equipment.

In addition, according to the third crystal blank, two connection portions 3a and 3b are formed to connect the same side of the inner region 1 with the outer region 2. The leads can be separately disposed on the two connection portions, and thus the wiring pattern can be easily formed.

Figure 6:
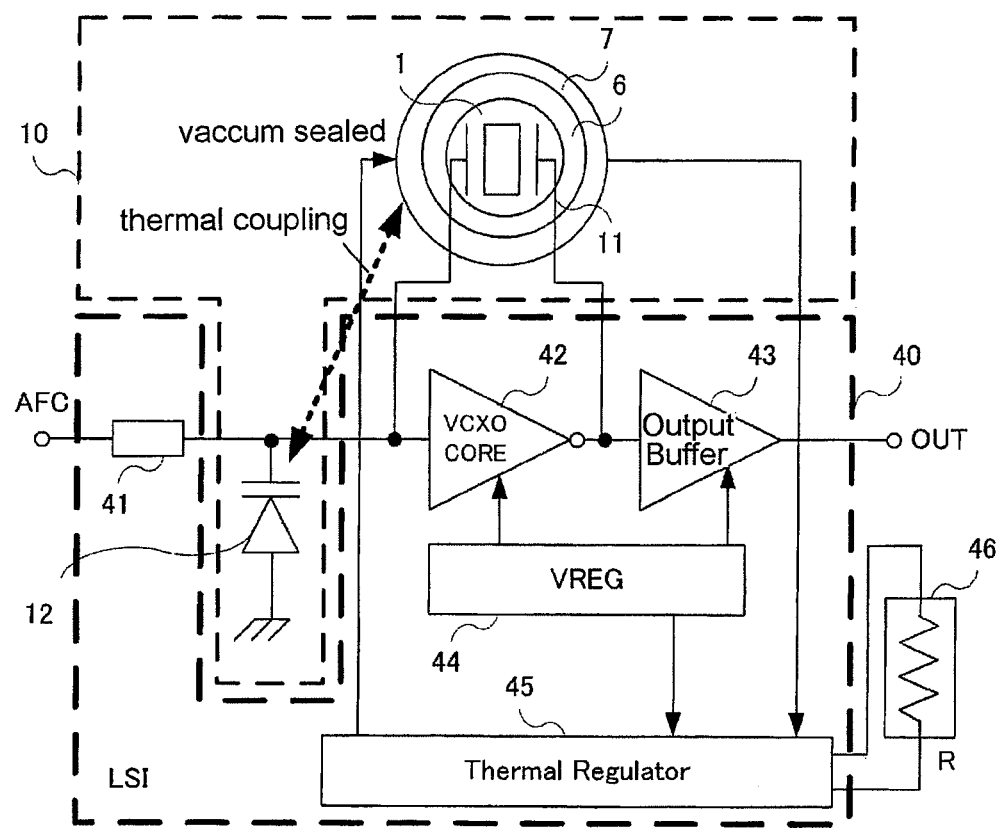
FIG. 6 depicts a circuit diagram of an oscillator.

The following paragraphs specify a crystal oscillator according to the embodiment of the invention. The crystal oscillator according to the embodiment of the invention (referred to as "the oscillator" hereinafter) is an oscillator which comprises the temperature-controlled crystal oscillating unit described in the aforementioned embodiments. FIG. 6 is a schematic diagram illustrating a circuit of the oscillator. As shown in FIG. 6, in the oscillator, a resistor 41, an oscillating circuit 42 (VCXO CORE) and an output buffer 43 are connected in series between an input terminal (AFC) and an output terminal (OUT), in which the input terminal (AFC) receives a control voltage from outside. In addition, the oscillating circuit 42 and a temperature-controlled crystal oscillating unit 11 are connected in parallel between the resistor 41 and the output buffer 43. In addition, an end of a variable-capacitive diode 12 is connected between the resistor 41 and the oscillating circuit 42, and the other end thereof is grounded.

The oscillator further comprises a thermal regulator 45 for controlling the temperature of the temperature-controlled crystal oscillating unit; and a constant-voltage power source 44 (VREG) for supplying a constant voltage. When a detected temperature from the temperature sensor 6 is inputted, the temperature control circuit 45 controls a current flown to the heater 7 based on the detected temperature. At this time, the temperature control circuit 45 controls the heater 7 to set a temperature around an inflection point of a frequency-temperature characteristic curve of the crystal oscillating unit as a target temperature and. In the case of SC-cut crystal blank, the temperature is about 85° C. The crystal oscillating unit 11 has a structure which is the same as that of any of the first, the second, and the third crystal oscillating units, and the crystal oscillating unit 11 comprises the inner region 11, the temperature sensor 6 and the heater 7.

In the above-described structure, the resistor 41, the oscillating circuit 42, the constant-voltage power source 44 and the temperature-controlled circuit 45 are integrated in a large scale integration (LSI). Moreover, the crystal oscillating unit 11 is formed on the crystal blank 10 and vacuum-sealed, as illustrated in FIG. 1. As a feature of the oscillator, the variable-capacitive diode 12 can be also disposed on the crystal blank 10 and vacuum-sealed.

Because the variable-capacitive diode 12 has poor temperature characteristics, the variable-capacitive diode 12 is thermally coupled with the crystal blank 10 by being disposed on the crystal blank 10, such that the temperature variation of the variable-capacitive diode 12 can be the same as that of the crystal. Temperature detection is performed by the temperature sensor 6 in a condition that the variable-capacitive diode 12 is included, and thus the output can be stabilized.

Further, the oscillator comprises a chip resistor 46 that is connected to the temperature control circuit 45 is disposed outside the LSI. To reduce the influence of temperature variation as much as possible, the temperature control circuit 45 controls the heater, so that the temperature of the crystal blank is set at the temperature around the inflection point of the frequency-temperature characteristic curve. The temperature of SC-cut crystal is about 85° C. However, the frequency-temperature characteristic of the crystal oscillating unit varies due to different crystal oscillating units, and accordingly the temperature of the inflection point varies as well. Variation of the temperature of the inflection point mainly results from the variation in the fabrication of the crystal.

Herein, in order to absorb the variation of the individual crystal oscillating unit, the oscillator is controlled in a manner that a resistance of the chip resistor 46 is changed to in accordance with the temperature of the inflection point of the individual crystal oscillating unit and the temperature of the heater is set to be at the temperature of the inflection point of the crystal oscillating unit. Specifically, a plurality of chip resistors 46 with different resistances are previously prepared, and then the chip resistor 46 with a most suitable resistance is connected to the temperature control circuit 45 according to the frequency-temperature characteristic of the packaged crystal oscillating unit. Accordingly, even if there is variation in the characteristic of the crystal oscillating unit, the oscillator can operate based on the temperature of the inflection point where the frequency variation due to temperature is reduced, and thus stabilized output can be obtained.

In other structures, instead of disposing the chip resistor, a resistor capable of setting its resistance and a non-volatile memory for storing a plurality of resistances of the resistor are integrated into the LSI. Under the structure, a desired resistance is selected and set from the non-volatile memory through an external signal line, and the temperature of the heater is adjustable according to the individual difference of the crystal oscillating unit.

Figure 7:
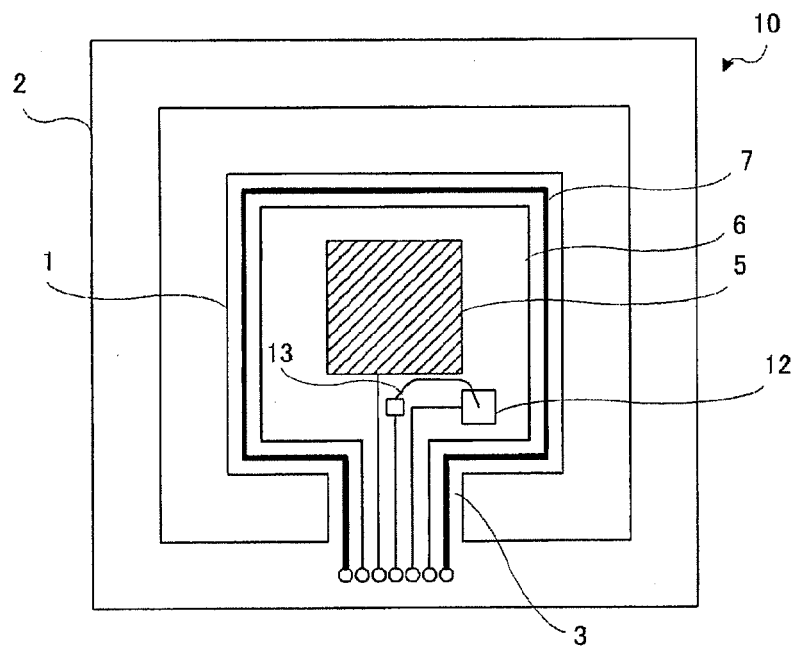
FIG. 7 illustrates the structure of a crystal blank of the oscillator.
Figure 8:
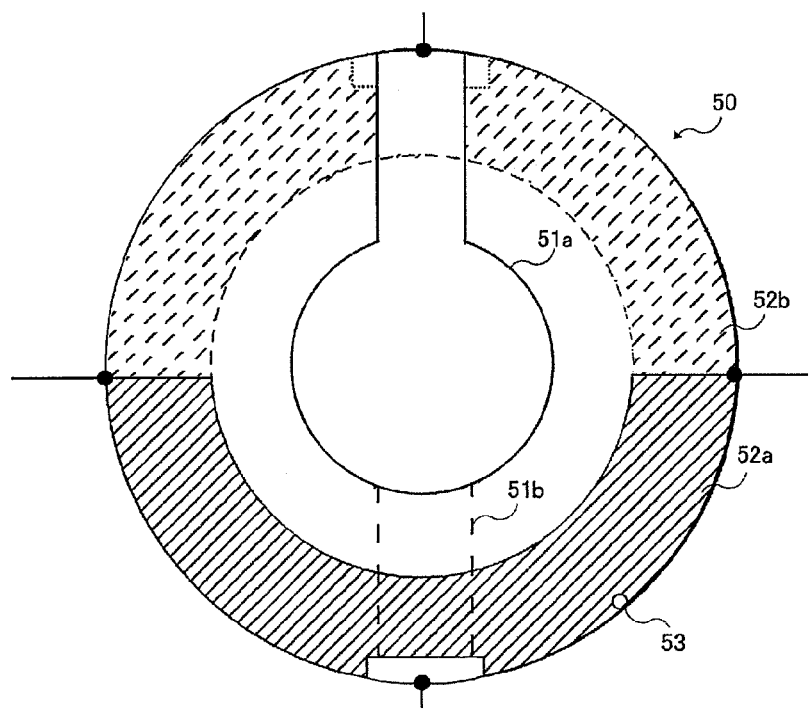
FIG. 8 is a planar schematic view of a conventional temperature-controlled crystal oscillating unit.

A structure of the crystal blank in the oscillator is described with reference to FIG. 7. FIG. 7 is a schematic diagram depicting the structure of the crystal blank in the oscillator. In this embodiment as shown in FIG. 7, the basic structure of the crystal blank in the oscillator is the same as that of the first crystal blank in FIG. 2. The crystal electrodes 5 are disposed on two opposite surfaces of the inner region 1 of the crystal blank 10, and the temperature sensor 6 and the heater 7 are formed around the periphery of the crystal electrode 5 on one surface of the inner region 1.

According to the crystal blank in the oscillator, a variable-capacitive diode 12 is carried on the surface of the inner region 1 where the temperature sensor 6 and the heater 7 are disposed, and is connected to the lead through wire bonding 13. Like the other leads, the lead of the variable-capacitive diode 12 is connected to the terminal on the outer region 2 through the connection portion 3. Then, this terminal is connected with a terminal of the LSI. If the variable-capacitive diode 12 has a structure of surface mount type, instead of wire bonding, the variable-capacitive diode 12 can be disposed by wire pattern only. Accordingly, through disposing the variable-capacitive diode 12 on the crystal blank and vacuum-sealing, the output frequency variation caused by the temperature variation can be suppressed, and the output can be further stabilized.

In addition, the variable-capacitive diode 12 can be disposed on a surface of the inner region 1, which is opposite to the surface where the temperature sensor 6 and the heater 7 are disposed. By disposing the variable-capacitive diode 12 on the opposite surface, the lead of the variable-capacitive diode 12 is formed on the back surface of the connection portion 3, and therefore the formation of the wire pattern becomes easier.

According to the embodiments of the invention, the crystal oscillator comprises the crystal oscillating unit 11 and the LSI having the oscillating circuit 42, and the variable-capacitive diode 12 connecting the oscillating circuit 42 is carried on the crystal blank 10 of the crystal oscillating unit 11 and then vacuum-sealed. Therefore, the temperature variation of the variable-capacitive diode 12 is the same as the crystal, and the temperature thereof can be detected by the temperature sensor 6. Therefore, there is an effect that a high-precision temperature control can be performed, and the output frequency can be stabilized.

In addition, according to the crystal oscillator of the embodiments, the temperature is set at a temperature around the inflection point of the frequency-temperature characteristic curve of the installed crystal oscillating unit, and the chip resistor 46 having proper resistance is connected to the temperature control circuit 45. Therefore, there are effects that the temperature of the heater is adjustable corresponding to the characteristic of the individual crystal oscillating unit so that the variation of the output frequency of the crystal oscillating unit is reduced, and the output can be stabilized.

Further, according to the crystal oscillator of the embodiments, instead of disposing the chip resistor 46, a resistor is integrated into the LSI, and according to an external operation, a desired resistance is selected from the non-volatile memory in which a plurality of resistances are stored, and then set selected resistance to the resistor. Therefore, there is an effect that a process of packaging the chip resistor 46 is not required, and the fabrication is simplified.

The invention is suitable for the temperature-controlled crystal oscillating unit and the crystal oscillator, which are advantageous in stabilizing output frequency and having firmness against the shock of falling, and are suitable for miniaturization and mass production.

What is claimed is:

1. A temperature-controlled crystal oscillating unit, including a crystal plate having two surfaces on which electrodes are disposed thereon; a heater, for heating the crystal plate; and a sensor, for detecting a temperature of the crystal plate, the temperature-controlled crystal oscillating unit comprising:
    a crystal blank, further comprising:
        the crystal plate;
        an outer region, formed for surrounding a periphery of the crystal plate; and
        a connection portion, disposed for connecting the crystal plate with the outer region,
    wherein on the crystal blank, the heater and the sensor are disposed to surround a periphery of the electrode on one surface or the other surface of the crystal plate,
    the electrodes, the heater and the sensor are connected to terminals on the outer region by leads respectively, and
    the leads of the heater and the sensor are drawn in the same direction as the leads of the electrodes are drawn.

2. The temperature-controlled crystal oscillating unit as claimed in claim 1, wherein the leads are formed on the connection portion.

3. The temperature-controlled crystal oscillating unit as claimed in claim 1, wherein the leads are wire bondings.

4. The temperature-controlled crystal oscillating unit as claimed in claim 1, wherein the heater and the sensor are respectively formed by a resistive body, which is formed at a temperature under a crystal $\alpha$-$\beta$ transient temperature.

5. A temperature-controlled crystal oscillating unit, including a crystal plate having two surfaces on which electrodes are disposed thereon; a heater, for heating the crystal plate; and a sensor, for detecting a temperature of the crystal plate, the temperature-controlled crystal oscillating unit comprising:
    a crystal blank, further comprising:
        the crystal plate;
        an outer region, formed for surrounding a periphery of the crystal plate; and
        a connection portion, disposed for connecting the crystal plate with the outer region,
    wherein on the crystal blank, the heater and the sensor are disposed to surround a periphery of the electrode on one surface or the other surface of the crystal plate,
    the electrodes, the heater and the sensor are connected to terminals on the outer region by leads respectively, and
    the crystal blank is a one-side-holding type, wherein the connection portion is disposed on one side of the crystal plate.

6. The temperature-controlled crystal oscillating unit as claimed in claim 5, wherein the connection portion is disposed at two positions on the one side.

7. The temperature-controlled crystal oscillating unit as claimed in claim 1, the crystal blank is a two-side-holding type, wherein the connection portion is disposed on each of two opposite sides of the crystal plate.

8. A temperature-controlled crystal oscillating unit, including a crystal plate having two surfaces on which electrodes are disposed thereon; a heater, for heating the crystal plate; and a sensor, for detecting a temperature of the crystal plate, the temperature-controlled crystal oscillating unit comprising:
    a crystal blank, further comprising:
        the crystal plate;
        an outer region, formed for surrounding a periphery of the crystal plate; and
        a connection portion, disposed for connecting the crystal plate with the outer region,
    wherein on the crystal blank, the heater and the sensor are disposed to surround a periphery of the electrode on one surface or the other surface of the crystal plate,
    the electrodes, the heater and the sensor are connected to terminals on the outer region by leads respectively, and
    the crystal blank is clamped between two silicon plates, each of which has a concave thereon, and is vacuum bonded in a state of being accommodated in the concaves of the silicon plates.

9. The temperature-controlled crystal oscillating unit as claimed in claim 8, wherein the silicon plates have resistivity, which provides a shield effect for shielding an electromagnetic field.

10. A crystal oscillator, comprising:
    the temperature-controlled crystal oscillating unit, including a crystal plate having two surfaces on which electrodes are disposed thereon; a heater, for heating the crystal plate; and a sensor, for detecting a temperature of the crystal plate, the temperature-controlled crystal oscillating unit comprising:
    a crystal blank, further comprising:
        the crystal plate;
        an outer region, formed for surrounding a periphery of the crystal plate; and
        a connection portion, disposed for connecting the crystal plate with the outer region,
    wherein on the crystal blank, the heater and the sensor are disposed to surround a periphery of the electrode on one surface or the other surface of the crystal plate,
    the electrodes, the heater and the sensor are connected to terminals on the outer region by leads respectively;
    an oscillating circuit; and
    a temperature control circuit,
    wherein a variable-capacitive diode, disposed at an input side of the oscillating circuit, is disposed on the crystal plate of the temperature-controlled crystal oscillating unit.

11. The crystal oscillator as claimed in claim 10, wherein the variable-capacitive diode is disposed on the surface of the crystal plate where the heater is formed.

12. The crystal oscillator as claimed in claim 10, wherein the variable-capacitive diode is disposed on one surface of the crystal plate, which is different from the surface where the heater is formed.

13. The crystal oscillator as claimed in claim 10, further comprising a chip resistor capable of adjusting a current flown to the heater, connected to the temperature control circuit.

14. The crystal oscillator as claimed in claim 10, wherein the oscillating circuit and the temperature control circuit are integrated into an integrated circuit,
   the integrated circuit further comprises a resistor for adjusting the current flown to the heater by a set resistance; and a non-volatile memory for storing a plurality of resistances, and
   the set resistance to the resistor is selected from the plurality of resistances stored in the non-volatile memory.

15. A crystal oscillator, comprising:
   the temperature-controlled crystal oscillating unit, including a crystal plate having two surfaces on which electrodes are disposed thereon; a heater, for heating the crystal plate; and a sensor, for detecting a temperature of the crystal plate, the temperature-controlled crystal oscillating unit comprising:
   a crystal blank, further comprising:
      the crystal plate;
      an outer region, formed for surrounding a periphery of the crystal plate; and
      a connection portion, disposed for connecting the crystal plate with the outer region,
   wherein on the crystal blank, the heater and the sensor are disposed to surround a periphery of the electrode on one surface or the other surface of the crystal plate,
   the electrodes, the heater and the sensor are connected to terminals on the outer region by leads respectively, wherein the leads are formed on the connection portion;
   an oscillating circuit; and
   a temperature control circuit,
   wherein a variable-capacitive diode, disposed at an input side of the oscillating circuit, is disposed on the crystal plate of the temperature-controlled crystal oscillating unit.

16. The crystal oscillator as claimed in claim 15, wherein the variable-capacitive diode is disposed on the surface of the crystal plate where the heater is formed.

17. The crystal oscillator as claimed in claim 15, wherein the variable-capacitive diode is disposed on one surface of the crystal plate, which is different from the surface where the heater is formed.

18. The crystal oscillator as claimed in claim 15, further comprising a chip resistor capable of adjusting a current flown to the heater, connected to the temperature control circuit.

19. The crystal oscillator as claimed in claim 15, wherein the oscillating circuit and the temperature control circuit are integrated into an integrated circuit,
   the integrated circuit further comprises a resistor for adjusting the current flown to the heater by a set resistance; and a non-volatile memory for storing a plurality of resistances, and
   the set resistance to the resistor is selected from the plurality of resistances stored in the non-volatile memory.

* * * * *